US008525401B2

(12) United States Patent
Lee

(10) Patent No.: US 8,525,401 B2
(45) Date of Patent: Sep. 3, 2013

(54) DISPLAY PANEL WITH SECURED MECHANICAL RELIABILITY

(75) Inventor: Choong-Ho Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/291,820

(22) Filed: Nov. 8, 2011

(65) Prior Publication Data

US 2012/0235557 A1 Sep. 20, 2012

(30) Foreign Application Priority Data

Mar. 15, 2011 (KR) ........................ 10-2011-0022951

(51) Int. Cl.
*H01J 1/62* (2006.01)
*H01J 63/04* (2006.01)

(52) U.S. Cl.
USPC ........... 313/495; 313/483; 313/496; 313/494; 313/497

(58) Field of Classification Search
None
See application file for complete search history.

(56) References Cited

U.S. PATENT DOCUMENTS

| | | | |
|---|---|---|---|
| 6,998,776 B2 | 2/2006 | Aitken et al. | |
| 7,432,649 B2 | 10/2008 | West | |
| 7,537,504 B2 | 5/2009 | Becken et al. | |
| 7,602,121 B2 | 10/2009 | Aitken et al. | |
| 7,815,480 B2 * | 10/2010 | Logunov et al. | 445/25 |
| 8,063,561 B2 * | 11/2011 | Choi et al. | 313/512 |
| 2009/0009063 A1 * | 1/2009 | Botelho et al. | 313/504 |
| 2009/0142984 A1 * | 6/2009 | Logunov et al. | 445/25 |
| 2011/0037383 A1 * | 2/2011 | Logunov et al. | 313/512 |

FOREIGN PATENT DOCUMENTS

| | | |
|---|---|---|
| KR | 10-2008-0000296 | 1/2008 |
| KR | 10-2008-0079976 | 9/2008 |
| KR | 10-2010-0108751 | 10/2010 |

OTHER PUBLICATIONS

Amendment filed on Jun. 26, 2012 of U.S. Appl. No. 12/884,335 (Divisional application of US2009/0142984).

* cited by examiner

*Primary Examiner* — Natalie Walford
(74) *Attorney, Agent, or Firm* — Robert E. Bushnell, Esq.

(57) ABSTRACT

A display panel with secured mechanical reliability comprises: a first plate including a display region and a non display region, a second plate facing the first plate, a first frit portion interposed between the first plate and the second plate and sealing the display region from outside, and a second frit portion separated from the first frit portion and comprising a plurality of sub-frits isolated from each other. The sub-frits are located between a first line which passes through points closest to edges of the first plate among outer points of the first frit portion with respect to a sealed space and extends parallel to the edges of the first plate and a second line which passes through points furthest from the edges of the first plate among inner points of the first frit portion with respect to the sealed space and extends parallel to the edges of the first plate.

16 Claims, 9 Drawing Sheets

DISPLAY PANEL WITH SECURED MECHANICAL RELIABILITY

CLAIM OF PRIORITY

This application makes reference to, incorporates the same herein, and claims all benefits accruing under 35 U.S.C. §119 from an application earlier filed in the Korean Intellectual Property Office on Mar. 15, 2011 and there duly assigned Ser. No. 10-2011-0022951.

BACKGROUND OF THE INVENTION

1. Field of the Invention

The present invention relates to a display panel which includes a glass package sealed with a frit, and which has secured mechanical reliability.

2. Description of the Related Art

An organic light-emitting diode (OLED) display is a self-luminous display and includes an organic material between two electrodes. The OLED display emits light as injected electrons and holes recombine in the organic material.

Electrodes and an organic layer in an OLED display are readily damaged by the interaction between oxygen and moisture which penetrate into the OLED display. Thus, a frit is interposed between glass plates to seal them and to protect internal elements against oxygen and moisture.

A frit, which is made of a glass material, is very vulnerable to impact and easily broken by tensile force. In addition, since frit is a brittle material which is easily broken by external force such as impact, it is difficult to use the frit in large substrates. To compensate for stress-sensitive characteristics of the frit, a method of adjusting a coefficient of thermal expansion (CTE) of the frit is used in a glass packaging process. However, the method has its limitations.

SUMMARY OF THE INVENTION

The present invention provides a display panel with secured mechanical reliability.

However, aspects of the present invention are not restricted to the ones set forth herein. The above and other aspects of the present invention will become more apparent to one of ordinary skill in the art to which the present invention pertains by referencing the detailed description of the present invention given below.

According to an aspect of the present invention, a display panel with secured mechanical reliability comprises: a first plate including a display region having light emitters and a non-display region; a second plate facing the first plate; a first frit portion interposed between the first plate and the second plate for sealing the display region from the outside; and a second frit portion separated from the first frit portion and comprising a plurality of sub-frits isolated from each other; wherein the sub-frits are located between a first line which passes through points closest to edges of the first plate among outer points of the first frit portion with respect to a sealed space and which extends parallel to the edges of the first plate, and a second line which passes through points furthest from the edges of the first plate among inner points of the first frit portion with respect to the sealed space and which extends parallel to the edges of the first plate.

According to another aspect of the present invention, a display panel comprises: a first plate including a display region having light emitters and a non-display region; a second plate facing the first plate; a first frit portion interposed between the first plate and the second plate for sealing the display region from the outside; and a second frit portion separated from the first frit portion and comprising a plurality of sub-frits isolated from each other; wherein the sub-frits comprise first sub-frits located outside the first frit portion with respect to a sealed space and second sub-frits located inside the first frit portion with respect to the sealed space; and wherein a width of the first frit portion in a direction perpendicular to the edges of the first plate is 0.25 to 0.75 times a width of a region formed by a first line which passes through points closest to the edges of the first plate among outer points of the first sub-frits with respect to the sealed space and which extends parallel to the edges of the first plate, and a second line which passes through points furthest from the edges of the first plate among inner points of the second sub-frits with respect to the sealed space and which extends parallel to the edges of the first plate.

According to another aspect of the present invention, a display panel comprises: a first plate including a display region having light emitters and a non-display region; a second plate facing the first plate; and a frit interposed between the first plate and the second plate for sealing the display region from the outside; wherein the frit comprises horizontal frit portions parallel to edges of the first plate and vertical frit portions perpendicular to the edges of the first plate; wherein the frit extends parallel to the edges of the first plate; and wherein the frit is in a shape of a loop having a zigzag pattern formed by the vertical frit portions and the horizontal frit portions alternately connected at right angles.

According to another aspect of the present invention, a display panel comprises: a first plate including a display region having light emitters and a non-display region; a second plate facing the first plate; a third frit portion interposed between the first plate and the second plate for sealing the display region from the outside; and a fourth frit portion located adjacent to the third frit portion and extending along a circumference of the fourth frit portion; wherein each of the third frit portion and the fourth frit portion comprises horizontal frit portions which are parallel to edges of the first plate and vertical frit portions which are perpendicular to the edges of the first plate and which protrude from the horizontal frit portions; and wherein each vertical frit portion of any one of the third frit portion and the fourth frit portion is inserted into a region surrounded by a horizontal frit portion and two vertical frit portions of the other one of the third and fourth frit portions.

The above and other features and advantages of the present invention will become more apparent by describing in detail exemplary embodiments thereof with reference to the attached drawings.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as being limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

Unless defined otherwise, all technical and scientific terms used herein have the same meaning as commonly understood by one of ordinary skill in the art to which this invention pertains. It is noted that the use of any and all examples, or exemplary terms provided herein, is intended merely to better illuminate the invention and is not a limitation on the scope of the invention unless otherwise specified. Furthermore, unless defined otherwise, all terms defined in generally used dictionaries may not be overly interpreted.

Figure 1:
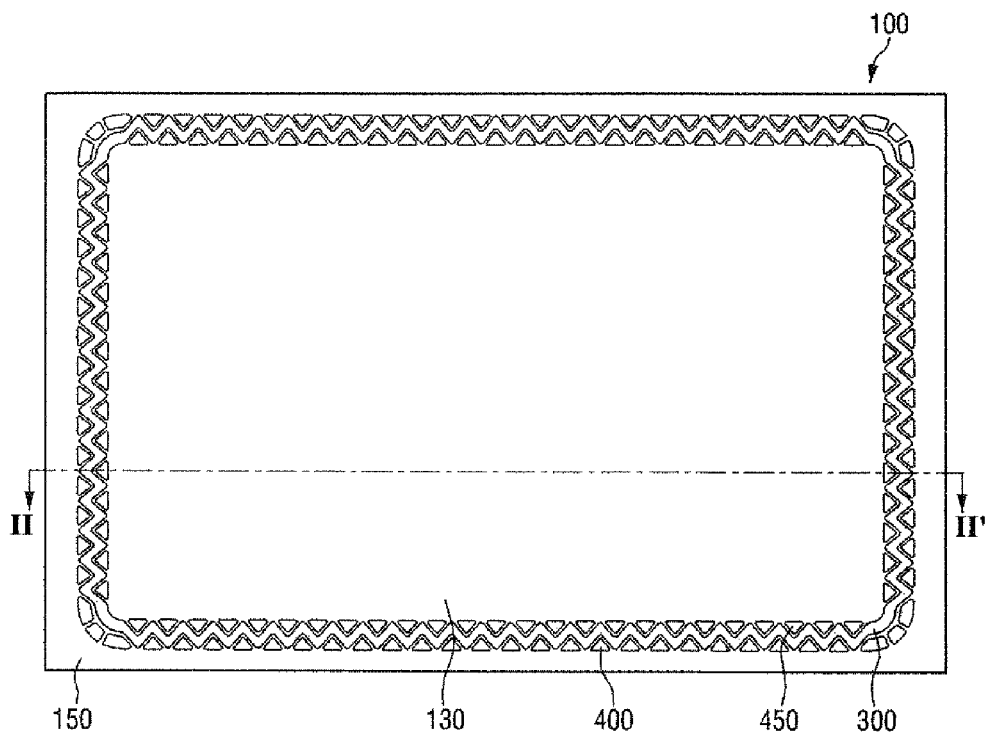
FIG. 1 is a schematic plan view of a display panel having a frit pattern according to an exemplary embodiment of the present invention.
Figure 2:
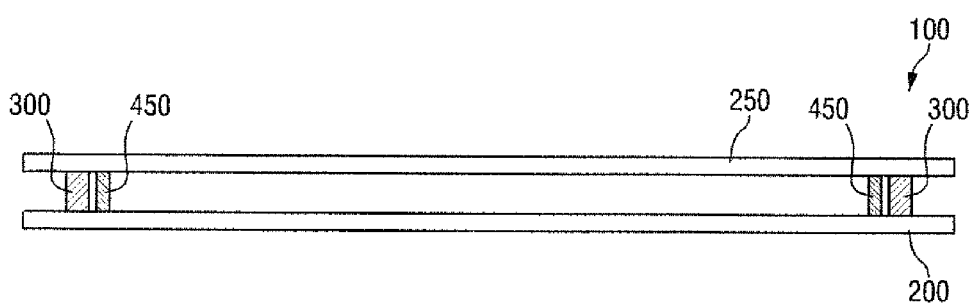
FIG. 2 is a cross-sectional view of the display panel taken along line II-II' shown in FIG. 1.

FIG. 1 is a schematic plan view of a display panel having a frit pattern according to an exemplary embodiment of the present invention, and FIG. 2 is a cross-sectional view of the display panel taken along line II-II' shown in FIG. 1.

Referring to FIGS. 1 and 2, the display panel 100 includes a first plate 200, a second plate 250, and a frit 300, 400 and 450 interposed between the first plate 200 and the second plate 250.

The first plate 200 may be made of, but is not limited to, a glass material such as borosilicate glass, soda-lime glass, or a mixture of the same.

In some embodiments, thermal stress may be applied to the first plate 200 by a heating unit (such as a laser) used in the process of attaching the frit 300, 400 and 450 to the first plate 200. Therefore, the first plate 200 may be made of a material which mostly does not absorb a wavelength range corresponding to thermal energy from the heating unit.

The first plate 200 may include a plurality of micro-devices for light emission. For example, the first plate 200 may include a plurality of thin-film transistors (TFTs) and a plurality of light emitters. In this regard, the light emitters may be organic light-emitting diodes (OLEDs).

The first plate 200 may be divided into a display region 130 and a non-display region 150 according to the above micro-devices. The display region 130 may include the light emitters.

The second plate 250 faces the first plate 200 and covers the light emitters of the first plate 200. Like the first plate 200, the second plate 250 may also be made of a glass material such as borosilicate glass, soda-lime glass, or a mixture of the same. In addition, the second plate 250 may be made of a material which mostly does not absorb a wavelength range corresponding to thermal energy from the heating unit.

The frit 300, 400 and 450 is interposed between the first plate 200 and the second plate 250, and provides a sealed space between the first plate 200 and the second plate 250. To provide a sufficient sealed space in the center of the display panel 100, the frit 300, 400 and 450 may be formed in a peripheral region of each of the first plate 200 and the second plate 250.

The frit 300, 400 and 450 includes a first frit portion 300 and a second frit portion 400 and 450. The first frit portion 300 substantially defines the sealed space between the first plate 200 and the second plate 250.

The first frit portion 300 is shaped like a closed curve with all of its points connected. For example, the first frit portion 300 may be in the shape of a loop extending along edges of the first plate 200. Since the first frit portion 300 substantially defines the sealed space, lower and upper ends of the first frit portion 300 are in contact with the first plate 200 and the second plate 250, respectively.

The first frit portion 300 may define the display region 130 and the non-display region 150 of the first plate 200. That is, a region inside the first frit portion 300 is defined as the display region 130, and a region outside the first frit portion 300 is defined as the non-display region 150.

Inside the first plate 200, the first frit portion 300 may be located adjacent to the edges of the first plate 200. For example, when the first plate 200 has a horizontal length of 400 mm and a vertical length of 370 mm, a length of the first frit portion 300 extending along a horizontal direction of the first plate 200 may be 360 mm, and a length of the first frit portion 300 extending along a vertical direction of the first plate 200 may be 330 mm.

That is, the first frit portion 300 may be approximately 20 mm away from horizontal edges of the first plate 200 and may be approximately 20 mm away from vertical edges of the first plate 200. However, these numbers are merely an example of dimensions of the display panel 100. The dimensions of the first and second plates 200 and 250, respectively, and the first frit portion 300 may be as varied as the number of products.

Since the display region 130 located inside the first frit portion 300 is sealed off from the outside by the first frit portion 300 as described above, oxygen and moisture cannot penetrate into the display region 130. Therefore, the performance of the OLEDs can be maintained, and the useful life of the display panel 100 can be extended.

The second frit portion 400 and 450 includes a plurality of sub-frits isolated from each other. The sub-frits surround the first frit portion 300 and are separated from the first frit portion 300. Since the sub-frits of the second frit portion 400 and 450 are isolated from each other, they cannot provide a completely sealed space. However, since the first frit portion 300 forms a closed curve, the completely sealed space can be provided by the first frit portion 300.

Like the first frit portion 300, lower and upper ends of the second frit portion 400 and 450 may be in contact with the first plate 200 and the second plate 250, respectively. As a result, the second frit portion 400 and 450 secures a gap between the first plate 200 and the second plate 250 and supports the first plate 200 and the second plate 250. Therefore, even when the first frit portion 300 has a substantially small width, since the second frit portion 400 and 450 makes up for the small width of the first frit portion 300, the overall mechanical strength of the frit can be improved.

Figure 3:
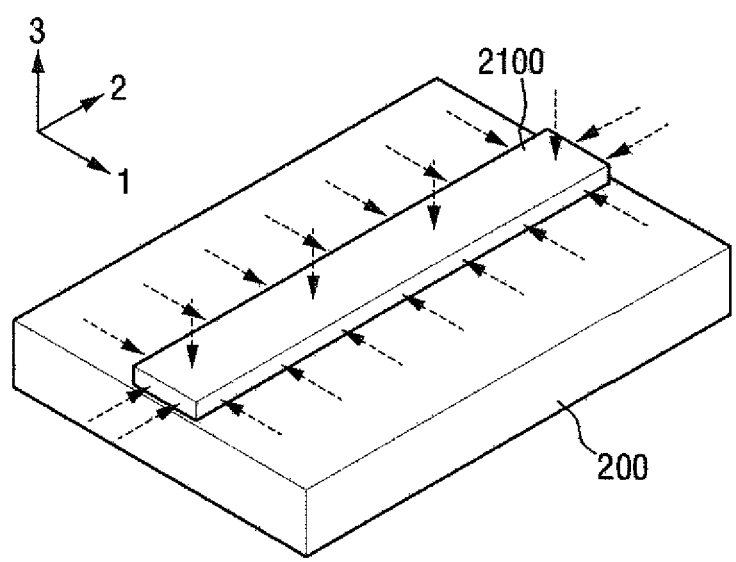
FIG. 3 illustrates stress applied to a frit on a plate.

FIG. 3 illustrates stress applied to a frit on a plate.

In FIG. 3, a first direction 1 is defined as a widthwise direction of a frit, a second direction 2 is defined as a lengthwise direction of the frit, and a third direction 3 is defined as a thicknesswise direction of the frit.

To seal the first plate 200 and the second plate 250 with a frit, a frit 2100 may be coated on any one of the first plate 200 and the second plate 250. Then, the plate coated with the frit 2100 may be bonded to the other one of the first plate 200 and the second plate 250. In this process, thermal energy is supplied to the frit 2100 using a heating unit such as a laser scanner. After being supplied with the thermal energy, the frit 2100 contracts as it cools down.

In this regard, a plate (for example, the first plate 200) made of a glass material shows a small temperature rise due to its relatively low coefficient of thermal expansion (CTE). In addition, the first plate 200, which is relatively larger than the frit 2100, hardly expands or contracts. On the other hand, the frit 2100 shows a large temperature rise due to its relatively high CTE. In addition, the frit 2100, which is relatively smaller than the first plate 200, can expand or contract relatively freely.

However, since the frit 2100 is already coated on the first plate 200 before being supplied with thermal energy, it cannot expand or contract easily, resulting in strong residual tensile stress in the frit 2100. The residual tensile stress may vary according to direction. That is, the frit 2100 can contract relatively freely in the third direction 3 (i.e., the thicknesswise direction of the frit 2100). However, the frit 2100 cannot contract easily in the second direction 2 (i.e., the lengthwise direction) or in the first direction 1 (i.e., the widthwise direction).

When a strong residual tensile stress is present in the frit 2100, the frit 2100 may be broken or peel off the first plate 200 because it is a brittle material which breaks easily with small impact. Consequently, the mechanical reliability of the display panel 100 is reduced.

When the frit 2100 is used in a large-sized OLED display, since the frit 2100 has to support two wide panels, the width of the frit 2100 should be increased sufficiently. However, an increase in the width of the frit 2100 makes it harder for the frit 2100 to contract in the first direction 1 (the widthwise direction), resulting in stronger residual tensile stress in the frit 2100.

Referring back to FIG. 1, in the current exemplary embodiment, the width of the frit related to the strength with which the frit supports the first and second plates 200 and 250, respectively, may be determined by the sum of widths of the first frit portion 300 and the second frit portion 400 and 450. That is, the width of the frit in the first direction 1 may be the distance from an innermost side of the frit, which includes the first frit portion 300 and the second frit portion 400 and 450, to an outermost side of the frit.

Therefore, the width of the frit in the first direction 1 is equal to or greater than the width of the first frit portion 300, and is equal to or greater than the width of the sub-frits of the second frit portion 400 and 450. This indicates that the width of the frit in the first direction 1 is greater when the first and second frit portions 300 and 400 and 450, respectively, are employed in combination than when either the first frit portion 300 or the second frit portion 400 and 450 is employed alone, and thus that the frit supports the first and second plates 200 and 250, respectively, with greater strength in the former case.

The width of the frit related to residual tensile stress may be determined not by the width of the entire frit, but by the width of each individual frit. That is, since the first frit portion 300 and the sub-frits of the second frit portion 400 and 450 are adjacent to but separated from each other, they do not affect each other's residual tensile stress.

The width of the first frit portion 300 in the first direction 1 (or the width of the first frit portion 300 perpendicular to a direction in which the first frit portion 300 extends) is equal to or smaller than the width of the entire frit. In addition, the width of the sub-frits of the second frit portion 400 and 450 is equal to or smaller than the width of the entire frit. Therefore, it can be understood that the residual tensile stress is substantially reduced when the width of the entire frit is equal to the sum of the widths of the first and second frit portions 300 and 400 and 450, respectively, compared with the situation when it is equal to the width of either the first frit portion 300 or the second frit portion 400 and 450.

Figure 4:
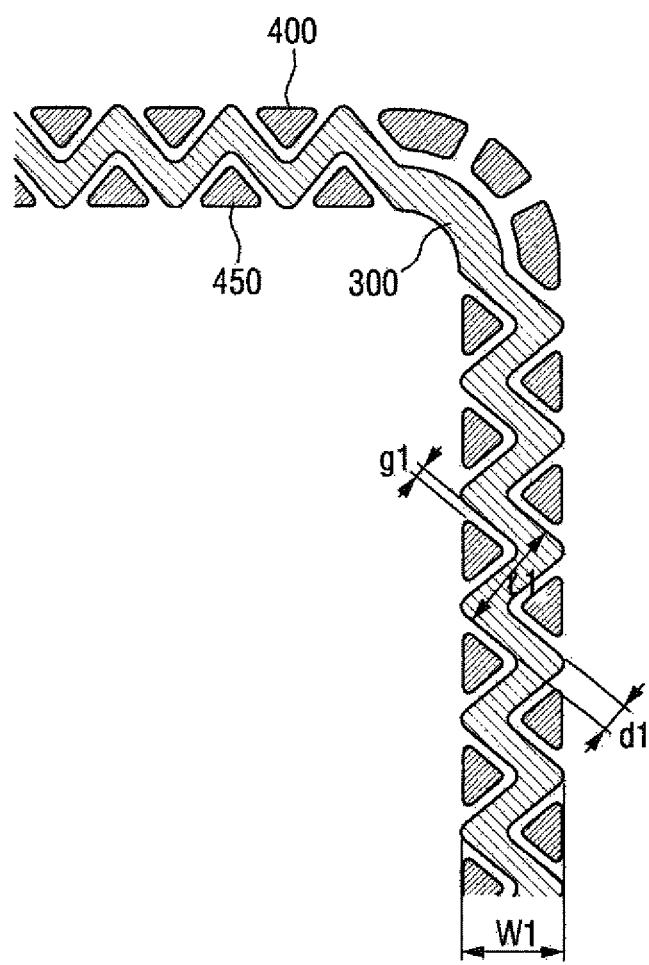
FIG. 4 is a partial view of the frit pattern shown in FIG. 1.

To secure a sufficient support strength and reduced residual tensile stress, the first frit portion 300 and the second frit portion 400 and 450 may have various patterns, an example of which is illustrated in FIG. 4.

FIG. 4 is a partial view of the frit pattern shown in FIG. 1.

Referring to FIG. 4, the first frit portion 300 extends parallel to the edges of the first plate 200 and is in the shape of a loop having a zigzag pattern. A straight line passing through points closest to the edges of the first plate 200 among outer points of the first frit portion 300 with respect to the sealed space (i.e., the display region 130 including the light emitters) and extending parallel to the edges of the first plate 200 may be defined as a first line. In addition, a straight line passing through points furthest from the edges of the first plate 200 among inner points of the first frit portion 300 with respect to the sealed space and extending parallel to the edges of the first plate 200 may be defined as a second line. In this case, the first frit portion 300 may be in the shape of a loop having a zigzag pattern which is at an acute angle relative to the first line and the second line. The distance between the first line and the second line may be defined as a width $W_1$ of the first frit portion 300.

Furthermore, regions of the first frit portion 300 which protrude outward with respect to the sealed space may be referred to as ridges, and regions of the first frit portion 300 which are recessed inward with respect to the sealed space may be referred to as valleys. In this case, the distance between each ridge and each valley may be defined as a length l1 of the zigzag pattern.

The distance between two parallel lines, which form edges of the first frit portion 300, and perpendicular to the length l1 of the zigzag pattern is defined as a width d1 of the zigzag pattern.

The first frit portion 300 having the zigzag pattern according to the current exemplary embodiment is bent in a lengthwise direction thereof. Accordingly, the first frit portion 300 having the zigzag pattern according to the current exemplary embodiment may have a shorter pattern length l1 than a frit having a linear pattern.

The shorter pattern length l1 has the effect of reducing the length of the first frit portion 300 in the lengthwise direction, thereby enabling the first frit portion 300 to contract relatively easily and thus have reduced residual tensile stress.

In addition, although the shorter pattern length l1 may not lead to a change in the width $W_1$ of the first frit portion 300, it has the effect of reducing the width d1 of the zigzag pattern. Therefore, the first frit portion 300 can contract relatively easily and have reduced residual tensile stress.

The contraction of the first frit portion 300 in a widthwise direction thereof is not totally unrelated to the contraction of the first frit portion 300 in the lengthwise direction thereof by the nature of the material. Due to the interaction between the contraction of the first frit portion 300 in the widthwise direction and that in the lengthwise direction, if the first frit portion 300 can contract freely in any one of the widthwise direction and the lengthwise direction, it can also contract freely in the other direction. Accordingly, the first frit portion 300 as a whole can contract freely and have reduced residual tensile stress.

The second frit portion 400 and 450 may be situated between the first and second lines described above. The second frit portion 400 and 450 is separated from the first frit portion 300 and includes a plurality of island-shaped sub-frits isolated from each other. The distance between the first frit portion 300 and the second frit portion 400 and 450 is defined as a gap $g_1$.

The second frit portion 400 and 450 may include first sub-frits 400 situated outside the first frit portion 300 with respect to the sealed space and second sub-frits 450 situated inside the first frit portion 300 with respect to the sealed space.

The first sub-frits 400 may be located between the ridges of the first frit portion 300 which protrude outward with respect to the sealed space, and the second sub-frits 450 may be located between the valleys of the first frit portion 300 which are recessed inward with respect to the sealed space.

A maximum width and length of the first sub-frits 400 and the second sub-frits 450 may be smaller than the length 11 of the zigzag pattern of the first frit portion 300. As a result, the first sub-frits 400 and the second sub-frits 450 may be located between the ridges of the first frit portion 300 and the valleys of the first frit portion 300.

While the second frit portion 400 and 450 shown in FIG. 4 is triangular, it may have various shapes, such as a polygonal shape.

The second frit portion 400 and 450 may be located in an empty space created by reducing the width of the first frit portion 300 to facilitate contraction. That is, to ensure that the frit has a sufficient width to support the first and second plates 200 and 250, respectively, the second frit portion 400 and 450 may be attached to the first and second plates 200 and 250, respectively.

Consequently, the first frit portion 300 has a loop shape and seals the light emitters off from the outside. In addition, for free contraction, the length of the first frit portion 300 is reduced in the widthwise direction and the lengthwise direction by changing the pattern of the first frit portion 300.

To compensate for a reduction in the area of the frit, which supports the first and second plates 200 and 250, respectively, due to the change in the shape of the first frit portion 300, the second frit portion 400 and 450 may be located around the first frit portion 300.

In some embodiments, in the case of a product with a 10-inch or less display, the width $W_1$ (i.e., the distance between the first and second lines) of the first frit portion 300 may be, but is not limited to, $W_1 < 1$ mm. In the case of a product with a 10-inch or more display, 1 mm $W_1 < 3$ mm. The width d1 of the zigzag pattern may be $0.25W_1 < d_1 < 0.75W_1$, and the length 11 of the zigzag pattern may be $l_1 < 5d_1$. In addition, the gap $g_1$ may be $g_1 < 0.1W_1$.

With the above dimensions, the frit can contract relatively freely and securely support the first and second plates 200 and 250, respectively. However, the dimensions which ensure superior mechanical reliability are not limited to the above example.

To increase the mechanical reliability of the frit, the addition of a material can be considered in addition to the pattern change.

When the CTE of the frit 300, 400 and 450 is largely different from the CTEs of the first and second plates 200 and 250, respectively, the frit may crack easily after being heated and cooled. To prevent this problem, the frit 300, 400 and 450 may be doped with a filler (e.g., a conversion filler or an additional filler) which reduces the CTE of the frit 300, 400 and 450 to or substantially to the CTEs of the first and second plates 200 and 250, respectively.

To attach the first frit portion 300 and the second frit portion 400 and 450 onto the first and second plates 200 and 250, respectively, the frit 300, 400 and 500 may be heated using a heating source such as a laser or an infrared lamp. To better absorb a wavelength range corresponding to energy from the heating source, the frit 300, 400 and 450 may include a component containing one or more absorption ions selected from the group consisting of iron, copper, vanadium, and neodymium, which are transition metals.

The light emitters (not shown) may be provided as additional elements. The light emitters may be OLEDs, and each of the OLEDs may include an anode electrode, a plurality of organic layers, and a cathode electrode. The light emitters may form the display region 130, and may be sealed off by the first frit portion 300.

Figure 5:
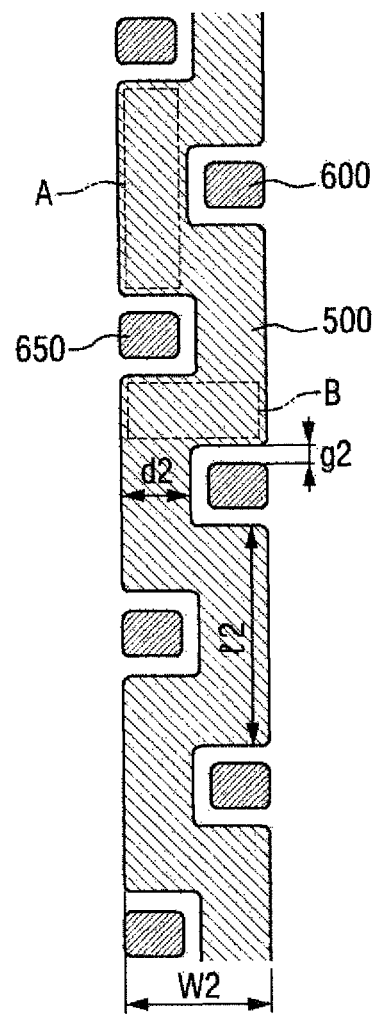
FIG. 5 is a partial view of a frit pattern according to another exemplary embodiment of the present invention.

FIG. 5 is a partial view of a frit pattern according to another exemplary embodiment of the present invention.

Referring to FIG. 5, the frit pattern according to the current exemplary embodiment may include a first frit portion 500 which seals light emitters from the outside and a second frit portion 600 and 650 which is separated from the first frit portion 500, and which includes a plurality of sub-frits isolated from each other.

The sub-frits of the second frit portion 600 and 650 may include first sub-frits 600 which are located outside the first frit portion 500 with respect to a sealed space and second sub-frits 650 which are located inside the first frit portion 500 with respect to the sealed space.

A straight line passing through points closest to edges of a first plate 200 among outer points of the first frit portion 500 with respect to the sealed space (i.e., a display region including the light emitters) and extending parallel to the edges of the first plate 200 may be defined as a first line. In addition, a straight line passing through points furthest from the edges of the first plate 200 among inner points of the first frit portion 500 with respect to the sealed space and extending parallel to the edges of the first plate 200 may be defined as a second line.

The first frit portion 500 includes horizontal frit portions A parallel to the first line and vertical frit portions B perpendicular to the first line. The first frit portion 500 extends parallel to the edges of the first plate 200 and is in the shape of a loop having a zigzag pattern formed by the vertical frit portions B and the horizontal frit portions A alternately connected at right angles. The distance between the first line and the second line is defined as a width $W_2$ of the first frit portion 500.

In addition, a length of the horizontal frit portions A is defined as a length $l_2$ of the zigzag pattern, and a length of a cross-section of the first frit portion 500, which is taken in a direction perpendicular to the first line, in the direction perpendicular to the first line is defined as a width $d_2$ of the zigzag pattern.

The first frit portion 500 having the zigzag pattern according to the current exemplary embodiment is bent in a lengthwise direction thereof. Therefore, the first frit portion 500 having the zigzag pattern according to the current exemplary embodiment may have a shorter pattern length $l_2$ than a frit having a linear pattern.

The shorter pattern length $l_2$ has the effect of reducing the length of the first frit portion 500 in the lengthwise direction, thereby enabling the first frit portion 500 to contract relatively easily and thus have reduced residual tensile stress.

In addition, although the shorter pattern length $l_2$ may not lead to a change in the width $W_2$ of the first frit portion 500, it has the effect of reducing the width $d_2$ of the zigzag pattern. Therefore, the first frit portion 500 can contract relatively easily and have reduced residual tensile stress.

The second frit portion 600 and 650 may be situated between the first and second lines described above. The second frit portion 600 and 650 is separated from the first frit portion 500 and includes a plurality of island-shaped sub-frits isolated from each other. The distance between the first frit portion 500 and the second frit portion 600 and 650 is defined as a gap $g_2$.

As described above, the second frit portion 600 and 650 may include the first sub-frits 600 situated outside the first frit portion 500 with respect to the sealed space and the second sub-frits 650 situated inside the first frit portion 500 with respect to the sealed space.

Each of the first sub-frits 600 and the second sub-frits 650 may be located in a space surrounded by two vertical frit portions B and one horizontal frit portion A which connects the two vertical frit portions B.

A maximum width and length of the first sub-frits 600 and the second sub-frits 650 may be smaller than the length l1 of the zigzag pattern of the first frit portion 500. As a result, the first sub-frits 600 and the second sub-frits 650 may be located in spaces surrounded by the horizontal frit portions A and the vertical frit portions B.

While the second frit portion 600 and 650 shown in FIG. 5 is square, it may have various shapes, such as a polygonal shape.

The second frit portion 600 and 650 may be located in an empty space created by reducing the width of the first frit portion 500 to facilitate contraction. That is, to ensure that the entire frit has a sufficient width to support the first and second plates, the second frit portion 600 and 650 may be attached to the first and second plates.

Consequently, the first frit portion 500 has a loop shape and seals the light emitters from the outside. In addition, for free contraction, the length of the first frit portion 500 is reduced in a widthwise direction and in a lengthwise direction by changing the pattern of the first frit portion 500.

To compensate for a reduction in the area of the frit, which supports the first and second plates, due to the change in the shape of the first frit portion 500, the second frit portion 600 and 650 may be located around the first frit portion 500.

In some embodiments, in the case of a product with a 10-inch or less display, the width $W_2$ (i.e., the distance between the first and second lines) of the first frit portion 500 may be, but is not limited to, $W_2<1$ mm. In the case of a product with a 10-inch or more display, 1 mm $W_2<3$ mm.

The width $d_2$ of the zigzag pattern may be 0.25 $W_2<d_2<0.75\ W_2$, and the length $l_2$ of the zigzag pattern may be $l_2<5d_2$. In addition, the gap $g_2$ may be $g_2<0.1\ W_2$.

With the above dimensions, the frit can contract relatively freely and securely support the first and second plates. However, the dimensions which ensure superior mechanical reliability are not limited to the above example.

Figure 6:
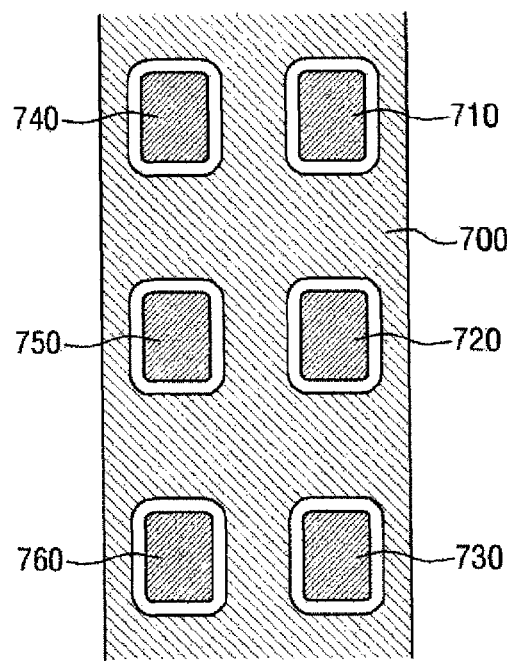
FIGS. 6 through 12 are partial views of frit patterns according to some other exemplary embodiments of the present invention.

FIG. 6 is a partial view of a frit pattern according to another exemplary embodiment of the present invention.

Referring to FIG. 6, the frit pattern according to the current exemplary embodiment includes a single first frit portion 700 which seals light emitters from the outside and a second frit portion which is separated from the first frit portion 700 and which includes a plurality of sub-frits 710 through 760 isolated from each other.

The second frit portion, including the sub-frits 710 through 760, is surrounded by the first frit portion 700 and is sealed off from the outside and a display region 130 including the light emitters. In FIG. 6, the sub-frits 710 through 760 are arranged in two columns. However, the arrangement of the sub-frits 710 through 760 may vary.

As shown in the drawing, the second frit portion 710 through 760 is separated from the first frit portion 700, and is surrounded by the first frit portion 700. Thus, spaces are formed between the first frit portion 700 and the second frit portion 710 through 760. Accordingly, a length of the first frit portion 700 is reduced in a widthwise direction perpendicular to a first line and in a lengthwise direction parallel to the first line.

Consequently, the entire frit can contract relatively freely while sealing the light emitters off from the outside. This enables the provision of a display panel 100 with increased mechanical reliability.

Figure 7:
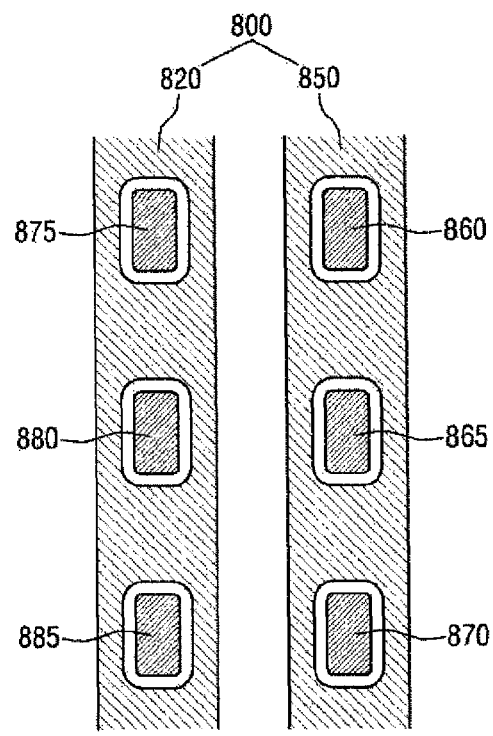

FIG. 7 is a partial view of a frit pattern according to another exemplary embodiment of the present invention.

Referring to FIG. 7, a loop-shaped first frit portion 800 which seals light emitters may include a plurality of sealing frits 820 and 850. The sealing frits 820 and 850 may include a first sealing frit 820 which substantially seals the light emitters from the outside and a second sealing frit 850 which is located outside the first sealing frit 820 with respect to a sealed space.

A second frit portion is separated from the first frit portion 800 and includes a plurality of sub-frits 860, 865, 870, 875, 880 and 885 isolated from each other. The second frit portion may be surrounded by the first and second sealing frits 820 and 850, respectively. In FIG. 7, the sub-frits 875, 880 and 885 surrounded by the first sealing frit 820 are arranged in one column, and the sub-frits 860, 865 and 870 surrounded by the second sealing frit 850 are arranged in one column. However, the arrangement of the sub-frits 860, 865, 870, 875, 880 and 885 may vary.

As shown in the drawing, the second frit portion 860, 865, 870, 875, 880 and 885 is separated from the first frit portion 800 and is surrounded by the first frit portion 800. Thus, spaces are formed between the first frit portion 800 and the second frit portion 860, 865, 870, 875, 880 and 885.

In addition, a space is formed between the first and second sealing frits 820 and 850, respectively, of the first frit portion 800. Accordingly, a length of the first frit portion 800 is reduced in a widthwise direction perpendicular to a first line and in a lengthwise direction parallel to the first line. Consequently, the entire frit can contract relatively freely while sealing the light emitters off from the outside. This enables the provision of a display panel 100 with increased mechanical reliability.

Figure 8:
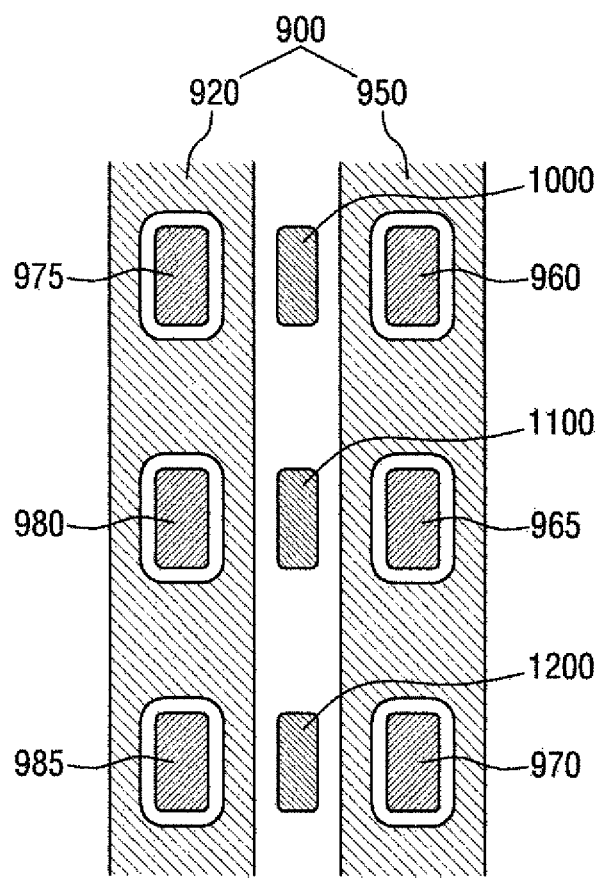

FIG. 8 is a partial view of a frit pattern according to another exemplary embodiment of the present invention.

Referring to FIG. 8, a loop-shaped first frit portion 900 which seals light emitters may include a plurality of sealing frits 920 and 950. The sealing frits 920 and 950 may include a first sealing frit 920 which substantially seals the light emitters from the outside and a second sealing frit 950 which is located outside the first sealing frit 920 with respect to a sealed space.

A second frit portion is separated from the first frit portion 900 and includes a plurality of sub-frits 960, 965, 970, 975, 980, 985, 1000, 1100 and 1200 isolated from each other. Specifically, the second frit portion may include sub-frits (capture-frits) 960, 965, 970, 975, 980 and 985 surrounded by the first and second sealing frits 920 and 950, respectively, and sub-frits(hiatus-frits) 1000, 1100 and 1200 interposed between the first and second sealing frits 920 and 950.

In FIG. 8, the sub-frits 960, 965 and 970 surrounded by the second sealing frit 950 are arranged in one column, the sub-frits 975, 980 and 985 surrounded by the first sealing frit 920 are arranged in one column, and the sub-frits 1000, 1100 and 1200 interposed between the first and second sealing frits 920 and 950, respectively, are arranged in one column. However, the arrangement of the sub-frits 960, 965, 970, 975, 980, 985, 1000, 1100 and 1200 may vary.

Since the second frit portion includes the surrounded sub-frits 960, 965, 970, 975, 980 and 985 and the interposed sub-frits 1000, 1100 and 1200 as shown in the drawing, spaces are formed between the first frit portion 900 and the second frit portion 960, 965, 970, 975, 980, 985, 1000, 1100 and 1200. In addition, a space is formed between the first and second sealing frits 920 and 950, respectively, of the first frit portion 900.

Accordingly, a length of the first frit portion 900 is reduced in a widthwise direction perpendicular to a first line and in a lengthwise direction parallel to the first line. Consequently, the entire frit can contract relatively freely while sealing the light emitters off from the outside. This enables the provision of a display panel 100 with increased mechanical reliability.

Figure 9:
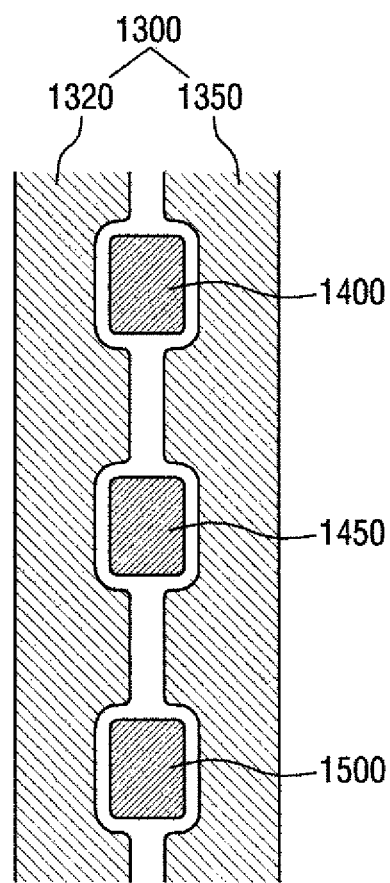

FIG. 9 is a partial view of a frit pattern according to another exemplary embodiment of the present invention.

Referring to FIG. 9, a loop-shaped first frit portion 1300 seals light emitters and includes a plurality of sealing frits 1320 and 1350. The sealing frits 1320 and 1350 may include a first sealing frit 1320 which substantially seals the light emitters from the outside and a second sealing frit 1350 which is located outside the first sealing frit 1320 with respect to a sealed space.

A second frit portion is separated from the first frit portion 1300 and includes a plurality of sub-frits 1400, 1450 and 1500 isolated from each other. The sub-frits(hiatus-frits) 1400, 1450 and 1500 of the second frit portion may be interposed between the first and second sealing frits 1320 and 1350, respectively.

In FIG. 9, the sub-frits 1400, 1450 and 1500 of the second frit portion are arranged in one column. However, the arrangement of the sub-frits 1400, 1450 and 1500 may vary.

Since the second frit portion includes the interposed sub-frits 1400, 1450 and 1500 as shown in the drawing, spaces are formed between the first frit portion 1300 and the second frit portion 1400, 1450 and 1500. In addition, a space is formed between the first and second sealing frits 1320 and 1350, respectively, of the first frit portion 1300.

Accordingly, a length of the first frit portion 1300 is reduced in a widthwise direction perpendicular to a first line and in a lengthwise direction parallel to the first line. Consequently, the entire frit can contract relatively freely while sealing the light emitters off from the outside. This enables the provision of a display panel 100 with increased mechanical reliability.

Figure 10:
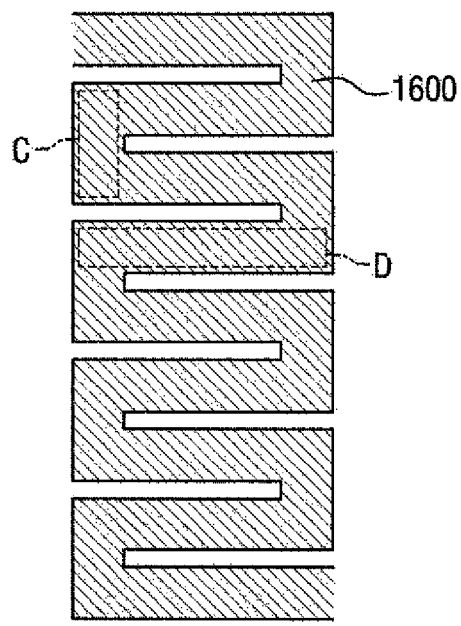

FIG. 10 is a partial view of a frit pattern according to another exemplary embodiment of the present invention.

Referring to FIG. 10, the frit pattern according to the current exemplary embodiment may include a single frit 1600 which seals light emitters.

The frit 1600 includes horizontal frit portions C parallel to edges of a first plate 200 and vertical frit portions D perpendicular to the edges of the first plate 200. The frit 1600 extends parallel to the edges of the first plate 200, and is in the shape of a zigzag pattern formed by the vertical frit portions D and the horizontal frit portions C alternatively connected at right angles.

Due to the zigzag pattern, a length of the frit 1600 is reduced in a lengthwise direction parallel to the edges of the first plate 200 and in a widthwise direction perpendicular to the edges of the first plate 200. Therefore, the frit 1600 can contract relatively freely in the lengthwise direction and the widthwise direction.

In addition, the area of the frit 1600 may be 0.9 to 0.95 times the area of a region surrounded by a first line which passes through outer edges of the horizontal frit portions C on an outermost side of the frit 1600 with respect to a sealed space and a second line which passes through inner edges of the horizontal frit portions C on an innermost side of the frit 1600 with respect to the sealed space.

As a result, the frit 1600 can securely support the first and second plates 200 and 250, respectively, despite a reduction in the area of the frit 1600 in the lengthwise direction and the widthwise direction.

Figure 11:
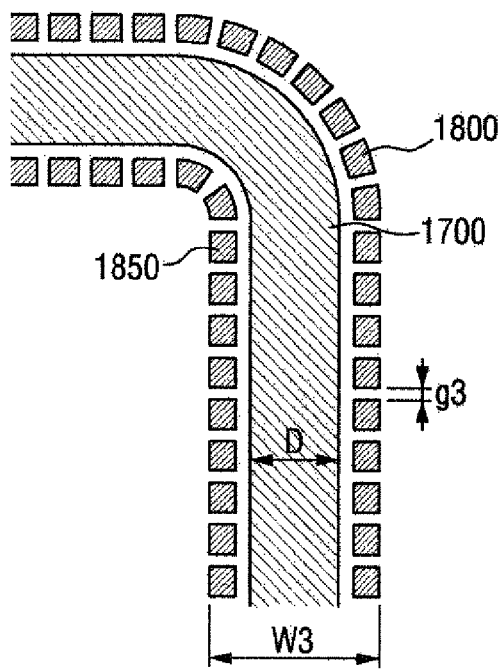

FIG. 11 is a partial view of a frit pattern according to another exemplary embodiment of the present invention.

Referring to FIG. 11, a first frit portion 1700 may extend in a direction parallel to edges of a first plate 200, and may be in the shape of a loop having a linear pattern.

A second frit portion may be separated from the first frit portion 1700 and may include a plurality of island-shaped sub-frits 1800 and 1850 isolated from each other. The sub-frits 1800 and 1850 may extend along a circumference of the first frit portion 1700.

The sub-frits 1800 and 1850 may include first sub-frits 1800 which are located outside the first frit portion 1700 with respect to a sealed space and second sub-frits 1850 which are located inside the first frit portion 1700 with respect to the sealed space. The first and second sub-frits 1800 and 1850, respectively, may be, but are not limited to, polygonal.

A straight line passing through outermost points of the first sub-frits 1800 with respect to the sealed space and extending parallel to edges of the first plate 200 may be referred to as a first line, and a straight line passing through innermost points of the second sub-frits 1850 with respect to the sealed space and extending parallel to the edges of the first plate 200 may be referred to as a second line.

The distance between the first line and the second line may be defined as a width $W_3$ of a frit, and a length of the first frit portion 1700 in a widthwise direction perpendicular to the first line may be defined as a width D of sealing.

In addition, the distance between every two adjacent sub-frits of the second frit portion 1800 and 1850 may be defined as a gap $g_3$, and a maximum width and length of the second sub-frit may be smaller than the width D of the first frit portion 1700.

The range of the width D which enables the first frit portion 1700 to contract relatively freely and securely support the first and second plates may be, but is not limited to, $0.25W_3 < D < 0.75 W_3$.

In some embodiments, in the case of a product with a 10-inch or less display, the width $W_3$ (i.e., the distance between the first and second lines) of the frit including the first frit portion 1700 and the second frit portion 1800 and 1850 may be, but is not limited to, $W_3 < 1$ mm. In the case of a product with a 10-inch or more display, 1 mm $W_3 < 3$ mm. In addition, the gap $g_3$ may be $g_3 < 0.1$ $W_3$.

With the above dimensions, the frit can contract relatively freely and securely support the first and second plates 200 and 250, respectively. However, the dimensions that ensure superior mechanical reliability are not limited to the above example.

This pattern structure formed by the first frit portion 1700 and the second frit portion 1800 and 1850 has the effect of reducing the length of the frit in the lengthwise direction and a widthwise direction. Therefore, the frit can contract relatively easily and have reduced residual tensile stress.

Figure 12:
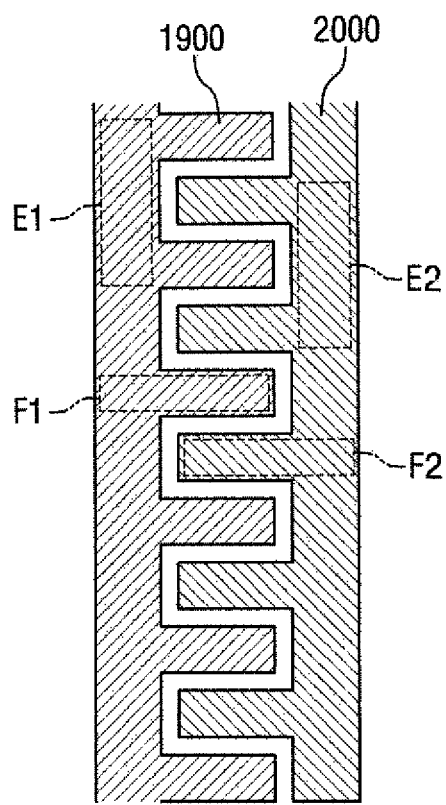

FIG. 12 is a partial view of a frit pattern according to another exemplary embodiment of the present invention.

Referring to FIG. 12, the frit pattern according to the current exemplary embodiment may include a loop-shaped third frit portion 1900 which substantially seals light emitters from the outside, and a loop-shaped fourth frit portion 2000 which extends along the third frit portion 1900.

The third frit portion 1900 and the fourth frit portion 2000 may respectively include horizontal frit portions E1 and E2 which are parallel to edges of a first plate 200, and vertical frit portions F1 and F2 which are perpendicular to the edges of the first plate 200 and protrude from the horizontal frit portions E1 and E2.

Each vertical frit portion (e.g., F2) of any one (e.g., the fourth frit portion 2000) of the third frit portion 1900 and the fourth frit portion 2000 may be inserted into a region surrounded by a horizontal frit portion (e.g., E1) and two vertical frit portions (e.g., F1) of the other one (e.g., the third frit portion 1900) of the third frit portion 1900 and the fourth frit portion 2000.

This positional relationship between the third frit portion 1900 and the fourth frit portion 2000 has the effect of reducing the width and length of the entire frit. As a result, the entire frit can contract relatively freely, while sealing the light emitters off from the outside. This enables the provision of a display panel 100 with increased mechanical reliability.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display panel, comprising:
   a first plate including a display region having light emitters and a non-display region;
   a second plate facing the first plate;
   a first frit portion interposed between the first plate and the second plate and sealing the display region from the outside; and
   a second frit portion separated from the first frit portion and including a plurality of sub-frits isolated from each other;
   the sub-frits located between a first line which passes through points closest to edges of the first plate among outer points of the first frit portion with respect to a sealed space and extends parallel to the edges of the first plate, and a second line which passes through points farthest from the edges of the first plate among inner points of the first frit portion with respect to the sealed space and extends parallel to the edges of the first plate.

2. The display panel of claim 1, wherein the sub-frits comprise first sub-frits located outside the first frit portion with respect to the sealed space and second sub-frits located inside the first frit portion with respect to the sealed space.

3. The display panel of claim 2, wherein the first frit portion comprises horizontal frit portions parallel to the first line and vertical frit portions perpendicular to the first line, extends parallel to the edges of the first plate, and is in a shape of a loop having a zigzag pattern formed by the vertical frit portions and the horizontal frit portions alternately connected at right angles.

4. The display panel of claim 3, wherein each of the sub-frits is located in a space formed by two vertical frit portions and a horizontal frit portion which connects the two vertical frit portions.

5. The display panel of claim 2, wherein the first frit portion extends parallel to the edges of the first plate and is in the shape of a loop having a zigzag pattern which is at an acute angle to the first line and the second line.

6. The display panel of claim 5, wherein the first sub-frits are located between ridges of the first frit portion which protrude outward with respect to the sealed space, and the second sub-frits are located between valleys of the first frit portion which are recessed inward with respect to the sealed space.

7. The display panel of claim 1, wherein the sub-frits are surrounded by the first frit portion.

8. The display panel of claim 1, wherein the first frit portion comprises a plurality of sealing frits.

9. The display panel of claim 8, wherein the sub-frits are surrounded by the sealing frits.

10. The display panel of claim 9, further comprising a plurality of sub-frits between the sealing frits.

11. The display panel of claim 8, wherein the sub-frits are interposed between the sealing frits.

12. A display panel, comprising:
    a first plate including a display region having light emitters and a non-display region;
    a second plate facing the first plate;
    a first frit portion interposed between the first plate and the second plate, and sealing the display region from the outside; and
    a second frit portion separated from the first frit portion and comprising a plurality of sub-frits isolated from each other;
    the sub-frits comprising first sub-frits located outside the first frit portion with respect to a sealed space and second sub-frits located inside the first frit portion with respect to the sealed space, and a width of the first frit portion in a direction perpendicular to the edges of the first plate being 0.25 to 0.75 times a width of a region formed by a first line which passes through points closest to the edges of the first plate among outer points of the first sub-frits with respect to the sealed space and which extends parallel to the edges of the first plate and a second line which passes through points farthest from the edges of the first plate among inner points of the second sub-frits with respect to the sealed space and extends parallel to the edges of the first plate.

13. The display panel of claim 12, wherein the first frit portion has a linear pattern parallel to the edges of the first plate.

14. A display panel, comprising:
    a first plate including a display region having light emitters and a non-display region;
    a second plate facing the first plate; and
    a frit interposed between the first plate and the second plate and sealing the display region from the outside;
    the frit comprising horizontal frit portions parallel to edges of the first plate and vertical frit portions perpendicular to the edges of the first plate, extending parallel to the edges of the first plate, and being in a shape of a loop having a zigzag pattern formed by the vertical frit portions and the horizontal frit portions alternately connected at right angles.

15. The display panel of claim 14, wherein an area of the frit is in a range of 0.9 to 0.95 times an area of a region surrounded by a first line which passes through outer edges of the horizontal frit portions on an outermost side of the frit with respect to a sealed space, and a second line which passes through inner edges of the horizontal frit portions on an innermost side of the frit with respect to the sealed space.

16. A display panel, comprising:
    a first plate including a display region having light emitters and a non-display region;
    a second plate facing the first plate;
    a third frit portion interposed between the first plate and the second plate and sealing the display region from the outside; and a fourth frit portion located adjacent to the third frit portion and extending along a circumference of the fourth frit portion;

each of the third frit portion and the fourth frit portion comprising horizontal frit portions which are parallel to edges of the first plate, and vertical frit portions which are perpendicular to the edges of the first plate and protrude from the horizontal frit portions, and each vertical frit portion of any one of the third frit portion and the fourth frit portion inserted into a region surrounded by a horizontal frit portion and two vertical frit portions of another one of the third and fourth frit portions.

\* \* \* \* \*